United States Patent
Chuang et al.

[11] 4,331,504
[45] May 25, 1982

[54] ETCHING PROCESS WITH VIBRATIONALLY EXCITED SF$_6$

[75] Inventors: Tung J. Chuang, Los Gatos; John W. Coburn; Eric Kay, both of San Jose, all of Calif.

[73] Assignee: International Business Machines Corporation, Armonk, N.Y.

[21] Appl. No.: 277,364

[22] Filed: Jun. 25, 1981

[51] Int. Cl.$^3$ .......................................... H01L 21/306
[52] U.S. Cl. ......................................... 156/635; 156/643; 156/646; 156/659.1; 156/345
[58] Field of Search ............. 156/635, 643, 646, 657, 156/659.1, 654, 662, 345; 252/79.1; 204/192 E; 250/492 R, 492 B

[56] References Cited

U.S. PATENT DOCUMENTS

| | | | |
|---|---|---|---|
| 3,679,502 | 7/1972 | Hays | 156/17 |
| 3,866,398 | 2/1975 | Vernon, Jr. et al. | 156/17 |
| 4,183,780 | 1/1980 | McKenna et al. | 156/646 X |
| 4,260,649 | 4/1981 | Dension et al. | 156/643 X |

OTHER PUBLICATIONS

J. I. Steinfeld et al., "Surface Etching by Laser-generated Free Radicals", Jour. of Electrochem. Soc., vol. 127, p. 514 (1980).

T. J. Chuang, "Infrared Laser Induced Reaction of SF$_6$ with Silicon Surfaces", Journal of Chemical Phys., 72 (11), Jun. 1980, p. 6303.

*Primary Examiner*—William Powell
*Attorney, Agent, or Firm*—Joseph G. Walsh

[57] ABSTRACT

A substrate which forms a volatile fluoride is etched and directionality is achieved using vibrationally excited SF$_6$ which has been exposed to laser irradiation. The substrate is etched through a mask having openings smaller than the diffraction limit of the laser light.

8 Claims, 2 Drawing Figures

ETCHING PROCESS WITH VIBRATIONALLY EXCITED $SF_6$

DESCRIPTION

1. Technical Field

The present invention is concerned with a process for selectively etching a substrate which forms a volatile fluoride. The process achieves directionality. Such etching is valuable, for example, in the construction of micro circuits.

2. Background Art

U.S. Pat. No. 3,679,502 shows a process for etching silicon by contacting it with $SF_6$ and a carrier gas at very high temperatures. The patent, however, is devoid of any teaching regarding vibrationally exciting the $SF_6$ molecules by laser irradiation.

U.S. Pat. No. 3,866,398 shows a process in which silicon is vaporized by exposure to a laser and then reacted with $SF_6$. The patent, however, does not teach selectively vibrationally exciting the $SF_6$ molecules by laser irradiation.

In the Journal of Electrochem. Soc. Vol. 127, P. 514 (1980), an article by Steinfeld et al, discusses etching of a silicon substrate by a dissociation process in which $SF_6$ is dissociated into $SF_5+F$ radicals which react with the silicon. The publication, however, makes no reference to vibrationally exciting $SF_6$ molecules.

The article by Chuang in the Journal of Chemical Phys. 72 (11) June 1980 p 6303, shows the reaction of vibrationally excited $SF_6$ molecules on a silicon substrate. This article, however, is entirely silent in regard to one of the critical features of the present invention, namely, the use of a mask with openings smaller than the diffraction limit of the laser light.

DISCLOSURE OF THE INVENTION

According to the present invention a substrate which is capable of forming a volatile fluoride is selectively etched by covering portions of it with a nonerodible mask containing openings and contacting the uncovered portions of the substrate with $SF_6$ which has been vibrationally excited by irradiation with a laser light. Directionality is achieved. It is a critical feature of the present invention that the openings in said mask are smaller than the diffraction limit of the laser light. When it is said that the openings are smaller than the diffraction limit of the laser light, it is meant that the openings have a minimum linewidth smaller than the diffraction limit. In the case of a circular opening, the minimum linewidth would be the diameter. In the case of a slit line opening, the minimum linewidth would be simply the width of the slit.

The present process is applicable to any substrate which forms a volatile fluoride. In particular, it is applicable to silicon, tantalum, titanium, tungsten and molybdenum.

BRIEF DESCRIPTION OF THE DRAWINGS

Further understanding of the present invention may be gained by examination of the accompanying drawings.

In the operation of the process of the present invention, vibrationally excited $SF_6$ molecules react with a substrate such as silicon to form volatile compounds, for example, $SiF_4$. Vibrationally excited $SF_6$ is easily generated by exciting $SF_6$ molecules with a carbon dioxide laser. It is essential to distinguish the process of the present invention using vibrationally excited $SF_6$ molecules from previously well-known multiphoton dissociation of $SF_6$. The process of the present invention has many advantages over the prior art dissociative process as will be discussed below.

Figure 1:
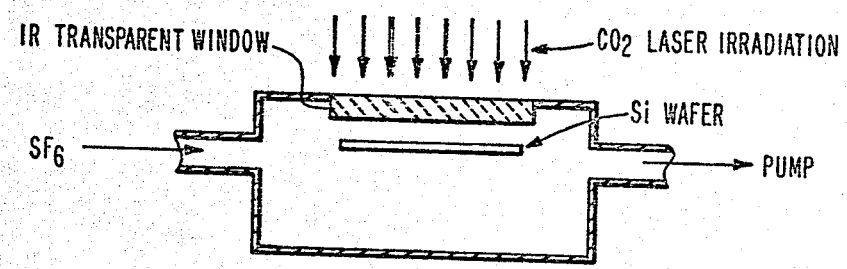
FIG. 1 (not to scale) is a diagram showing one conventional apparatus suitable for use in the process of the present invention.

Turning again to FIG. 1, illustrating an apparatus suitable for use in the process of the present invention, it may be seen that a $CO_2$ laser with appropriate focusing optics is used in conjunction with a small vacuum chamber equipped with a mechanical pump and an $SF_6$ gas admission system. The substrate to be etched, for example a silicon wafer, is placed below an IR transparent window through which the laser shines.

Figure 2:
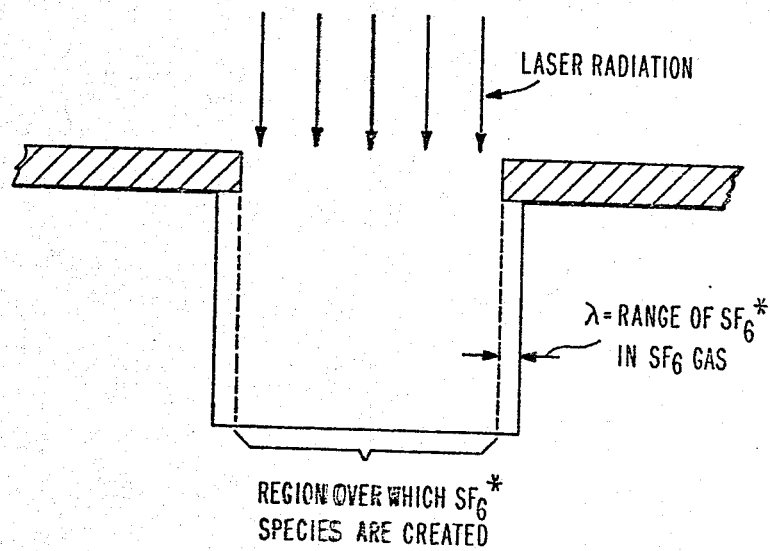
FIG. 2 (not to scale) is a diagram illustrating the concept of directional etching which is obtained using the process of the present invention. This concept will be discussed further below.

Turning next to FIG. 2, the actual etching process is diagrammatically shown. The substrate is selectively covered with a nonerodible mask containing openings, one of which is shown in FIG. 2. This nonerodible mask can satisfactorily be made of such materials as silicon dioxide or aluminum. The $SF_6$ molecules are in contact with the uncovered portions of the substrate. The laser irradiation shines through the openings in the mask and vibrationally excites the $SF_6$ molecules which then react with the substrate to form a volatile fluoride. Etching is thus accomplished.

A very important feature of the present process is the limited and controllable range of the vibrationally excited $SF_6$ molecules, which are often represented as $SF_6^*$. These excited molecules are deexcited back to chemically inert $SF_6$ after collision with other $SF_6$ molecules. Therefore, only vibrationally excited $SF_6$ molecules which are created near the substrate surface will survive long enough to react with the substrate. The range or mean-free path of the excited $SF_6$ species is inversely proportional to the $SF_6$ gas pressure. The consequences of this limited and controllable range are directional etching, where the width of the etched feature is equal to the dimension of the opening in the mask plus twice the range of the vibrationally active $SF_6$ species. (This range is shown by $\lambda$ in FIG. 2.) It should be noted that the range of vibrationally excited $SF_6$ molecules, at 760 TORR of $SF_6$, is only about 1500 A.

It is still an additional advantage of the present invention that the process has no loading effect, that is, the etch rate does not depend on wafer area. Furthermore, there is no etch rate dependence of any kind on vacuum system parameters so long as the gas flow is adequate to remove the volatile fluoride etch product. Additionally, no active species reach the pumping system. Thus, problems associated with pumping toxic gases are avoided.

With the present process, etch rates on the order of thousands of A units per minute can be obtained. Silicon etch rates are about 1 A per laser pulse and laser pulse rates of 100 HZ are easily available. Wafer heating is not a problem because the laser power density must be kept below the threshold density required for the multiphoton dissociation of $SF_6$ and the high $SF_6$ gas pressure which is used helps to cool the wafer.

It should again be emphasized that a critical feature of the present invention is the use of a mask with openings smaller than the diffraction limit of the laser light. Prior to the present invention, it would have been expected that when using the $CO_2$ laser, the best resolution for etching would have been limited by the diffraction limit of the light whose wavelength is 10.6 $\mu$m. We have found that this is not the case and that, in fact, by using a mask with openings smaller than the diffraction limit of the laser light, high resolution etching with no undercutting is obtained. It should be mentioned that in one preferred variation of the present invention, the openings in the mask are approximately a full order of magnitude smaller than the diffraction limit of the laser light. That is to say, the openings in the mask are on the order of about 1 $\mu$m.

The present invention has several advantages over prior art plasma etching. The present process does not result in etching of the mask, therefore, photoresist masks may be used. In the present process directionality is simply controlled by pressure, whereas in plasma etching it involves control of neutral vs. ion enhanced chemistry. Furthermore, the present process lends itself very readily to scaling up, because the etching chemistry is very localized, that is, independent of apparatus dimensions.

It should be emphasized that the present invention, unlike the prior art which emphasized laser induced fragmentation, relies upon vibrationally excited molecules having a very short lifetime and obtained by using low power (about 1 joule per $cm^2$) with 10 megawatt per $cm^2$ per pulse. Because of the low power there is no laser induced damage. The lifetime of the vibrationally excited species leads to high resolution. The directionality can be controlled by varying the pressure and subsequent lifetime. At 20 TORR the resolution is about 10 microns. At 200 TORR the resolution is 1 micron. At atmospheric pressure the resolution is about 0.3 microns.

We claim:

1. In a process for etching a substrate which forms a volatile fluoride and achieving directionality by the steps of:
    (1) selectively covering portions of the substrate with a non-erodible mask containing openings;
    (2) contacting the uncovered portions of the substrate with $SF_6$, and
    (3) vibrationally exciting the $SF_6$ by exposing it to irradiation with laser light, the improvement characterized in that the openings in said mask are smaller than the diffraction limit of the laser light.
2. A process as claimed in claim 1 wherein the substrate is silicon.
3. A process as claimed in claim 1 wherein the substrate is tantalum.
4. A process as claimed in claim 1 wherein the substrate is titanium.
5. A process as claimed in claim 1 where the substrate is tungsten.
6. A process as claimed in claim 1 wherein the substrate is molybdenum.
7. A process as claimed in claim 1 wherein the laser light is from a pulsed $CO_2$ laser.
8. A process as claimed in claim 1 wherein the openings in said mask are on the order of about 1 $\mu$m in minimum linewidth.

* * * * *